United States Patent [19]

Hirano et al.

[11] Patent Number: 4,961,823
[45] Date of Patent: * Oct. 9, 1990

[54] METHOD OF MANUFACTURING CALCIUM CARBONATE SINGLE CRYSTAL

[75] Inventors: Shinichi Hirano, 123, Meidai Yada-cho Syukusha, 66, Yada-cho 2-chome, Higashi-ku, Aichi-ken; Ryo Toyokuni; Hiroshi Kuroda, both of Tokyo, all of Japan

[73] Assignees: Shinichi Hirano; Seiko Instruments & Electronics Ltd., both of Japan

[ * ] Notice: The portion of the term of this patent subsequent to Aug. 9, 2005 has been disclaimed.

[21] Appl. No.: 146,294

[22] Filed: Jan. 20, 1988

Related U.S. Application Data

[63] Continuation-in-part of Ser. No. 924,402, Oct. 29, 1986, Pat. No. 4,762,588.

[30] Foreign Application Priority Data

| Nov. 12, 1985 | [JP] | Japan | 60-253124 |
| Mar. 17, 1987 | [JP] | Japan | 62-61942 |
| Apr. 23, 1987 | [JP] | Japan | 62-100470 |
| Oct. 13, 1987 | [JP] | Japan | 62-257762 |

[51] Int. Cl.$^5$ ............ C30B 29/10; C30B 7/10
[52] U.S. Cl. ............ 156/623 R; 156/621; 156/623 Q; 156/DIG. 78; 423/430
[58] Field of Search ............ 156/621, 623 R, 623 Q, 156/DIG. 78; 423/430

[56] References Cited

U.S. PATENT DOCUMENTS

| 3,201,209 | 8/1965 | Caparase et al. | 156/623 R |
| 3,271,114 | 9/1966 | Kolb | 156/623 R |
| 3,356,463 | 12/1967 | Ballman et al. | 156/623 Q |
| 3,440,025 | 4/1969 | Laudise et al. | 156/623 R |
| 4,685,995 | 8/1987 | Hirano | 423/430 |
| 4,711,769 | 12/1987 | Inoue et al. | 423/305 |

FOREIGN PATENT DOCUMENTS

| 1601960 | 11/1970 | France | 156/DIG. 78 |
| 1049347 | 11/1966 | United Kingdom | 156/DIG. 78 |

OTHER PUBLICATIONS

Kinloch et al., Hydrothermal Growth of Calcite in Large Autoclaves, Journal of Crystal Growth, 24/25 (1974), pp. 610-613.
Hirano et al, Solubility and Hydrothermal Growth of Calcite Single Crystals In Nitrate Solutions, Journal of Crystal Growth, 79(1986), 223 to 226.
Manufacturing Technology Note, No. R11-599, Mar. 1978, Office of Manufacturing Technology, Alexandria, Va., "Growth of Synthetic Calcite Crystals".
Journal of Crystal Growth, vol. 79(1), Nos. 1-3, Dec. 2, 1986, pp. 223-226, Elsevier Science Publishers B.V., "Solubility and Hydrothermal Growth of Calcite Single Crystal in Nitrite Solutions".
Journal of Crystal Growth, vol. 3, No. 1, Apr. 1, 1977, pp. 29-37, North-Holland Publishing Co., "Defects Revealing the Two Growth Hydrothermal Synthetic Calcite".

Primary Examiner—Olik Chaudhuri
Assistant Examiner—Robert M. Kunemund
Attorney, Agent, or Firm—Bruce L. Adams; Van C. Wilks

[57] ABSTRACT

A starting material composed of calcium carbonate is dissolved in a nitrate aqueous solution containing either $Ca(NO_3)_2$ or $NH_4NO_3$ under application of heat and pressure. The starting material is hydrothermally synthesized within the nitrate aqueous solution to effect the rapid growth of calcium carbonate single crystal.

18 Claims, 1 Drawing Sheet

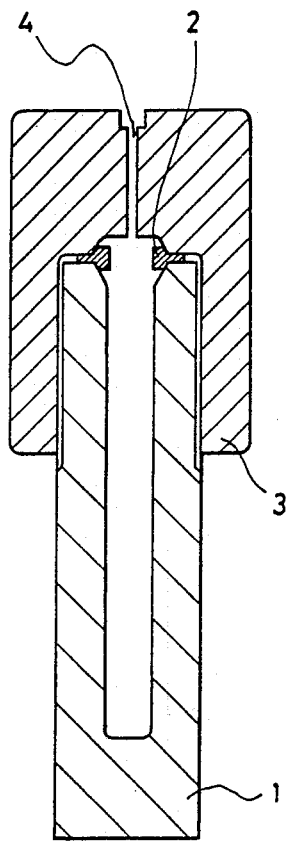
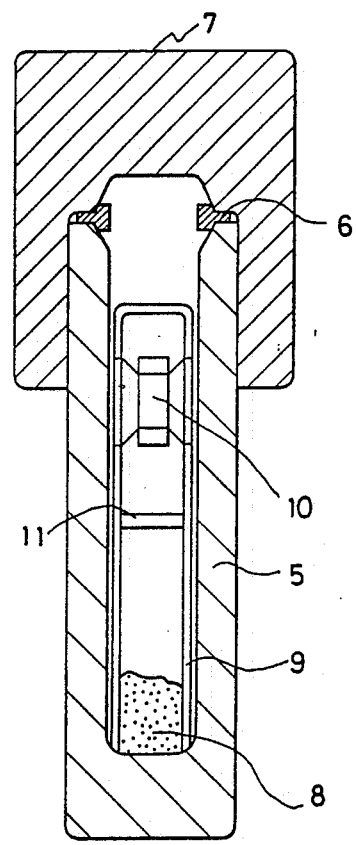
F I G. 1  F I G. 2

METHOD OF MANUFACTURING CALCIUM CARBONATE SINGLE CRYSTAL

CROSS-REFERENCE TO RELATED APPLICATION

This application is a continuation-in-part of application Ser. No. 924,402, filed Oct. 29, 1986 and now U.S. Pat. No. 4,762,588.

BACKGROUND OF THE INVENTION

This invention relates to a method of manufacturing calcium carbonate single crystal (calcite) widely used as an optical polarizer, etc.

Single crystals of calcium carbonate ($CaCO_3$) are suitable for optical uses and, for this purpose, natural calcite crystals are currently used. Calcite single crystals exhibit double refraction of incident light. Calcite has a high refractive index and is used as a polarizing prism in optical apparatus. Because of recent advances in the design of optical apparatus, such as laser optics and an optical communication apparatus, there is an increased demand for a material with excellent optical characteristics. In this regard, calcite single crystal is an ideal material, and is expected to be more and more in demand.

Calcite single crystal has been obtained only from natural sources because it is not yet being industrially synthesized. For commercial use, natural calcite must be colorless and transparent, must have no bubbles or cracks and no twining and no internal strains, and must be greater than a certain size. However, calcite single crystal that will meet these requirements is found only in limited quantities in the Republic of South Africa, Mexico, etc., and reserves are running low.

There have been experiments to synthesize calcium carbonate single crystal. One method is crystallization from a solvent, another is the synthesizing from a gel, a third is crystallization from a flux or melt, a fourth is hydrothermal synthesis, and recently an FZ method under high pressure have been suggested. However, optical characteristics such as transparency of the resultant crystals have not been entirely satisfactory due to defects such as impurities, mixing, dislocations, inclusions, or internal strains.

Among the methods tried for the manufacture of calcium carbonate single crystal, hydrothermal synthesis is most similar to the process by which natural calcite is grown as a hydrothermal ore deposit. Therefore, hydrothermal synthesis can produce a desired calcium carbonate single crystal with characteristics similar to natural calcite.

The hydrothermal synthesis process for manufacturing calcium carbonate single crystal utilizes an aqueous solvent hold at a predetermined temperature and pressure in an autoclave. Alkaline aqueous solutions such as sodium hydroxide (NaOH) or alkali carbonate aqueous solutions such as sodium carbonate ($Na_2CO_3$), potassium carbonate ($K_2CO_3$), etc. are generally used as the aqueous solvent. This method for growth of calcium carbonate single crystal is essentially a modification of conventional growth technology for artificial crystals. Under the following conditions:

Solvent-6 mol $K_2CO_3$ aqueous solution
Temperature-410° to 445° C.
Pressure-1720 atmospheres
Growth speed-50 $\mu$m/day about 3 mm growth layer of a calcium carbonate single crystal has been obtained.

The above described hydrothermal synthesis is disclosed in D. R. Kinlock H, R. F. Belt, R. C. Puttbac H, Journal of Crystal Growth 24/25 (1974) 610-613.

A method of manufacturing calcium carbonate single crystal grown by hydrothermal synthesis using a chloride aqueous solution is described and claimed in the commonly assigned U.S. Pat. No. 4,685,995, of Shinichi Hirano and Seiko Instruments & Electronics Ltd., issued Aug. 11, 1987.

In crystal growth method of calcium carbonate utilizing the conventional alkali carbonate aqueous solution, crystal can be grown, but there are problems to be solved as follows:

Firstly, due to the high concentration of solvent, inclusions frequently occur in the resultant crystals. These inclusions will result in inferior optical characteristics. Next, due to a high concentration of solvent, it is impossible to achieve sufficient pressure for quantitative production. In other words, the higher the solvent concentration, the lower the obtained pressure becomes even with the same filling-up rate. In the case of a 6 mol concentration of $K_2CO_3$ aqueous solution at 445° C. and a filling-up rate of nearly 100%, it is impossible to obtain a pressure of 1720 atmospheres. Due to this, it is necessary to apply additional pressure from outside the autoclave thereby causing the apparatus and pressure system etc. to be too complicated. Using an alkali carbonate aqueous solution, the growth speed will be very slow, i.e., 50 $\mu$m/day, and therefore it will take more or less a year to grow crystals large enough to be used as optical elements.

It is an object of the present invention to provide a simple method to grow relatively quickly excellent calcium carbonate single crystal with good optical characteristics.

According to the present invention, there is provided a method for manufacturing a calcium carbonate single crystal by hydrothermal synthesis at a given temperature and pressure within a nitrate aqueous solution as a solvent.

BRIEF DESCRIPTION OF THE DRAWINGS

FIG. 1 is a sectional view of a test tube used in Example 1 according to the present invention; and FIG. 2 is a sectional view of a pressure vessel used in Example 2 according to the present invention.

DETAILED DESCRIPTION OF THE INVENTION

The problems encountered in growing calcium carbonate single crystal by the prior art hydrothermal synthesis, namely, inferior optical quality, complicated apparatus, and long growth period, etc. result from having to use a high concentration solvent and high pressure. In other words, the problems stem from the choice of solvent and growth conditions.

A nitrate aqueous solution is now found best to avoid these problems, among various kinds of existing solvent such as alkaline, carbonate acid and chloride solutions.

In the present invention, hydrothermal synthesis initiating material is dissolved in a suitable aqueous solution of solvent at an appropriate temperature and pressure, and crystallization on a substrate is effected by gradual cooling or by transporting nourishment (material) through a temperature differential. The solvent should, therefore, be such that the starting material dissolves well in it and it should have little corrosive action on the apparatus used. A nitrate aqueous solution as a solvent is found to be ideal.

The invention is further described with reference to the following Examples.

EXAMPLE 1

As starting material, commercially available calcium carbonate of high purity was used. For hydrothermal synthesis an autoclaval test tube of stellite quality No. 25 was used. FIG. 1 shows the structure of the test tube having a pressure vessel body 1 shows the structure of the test tube having a pressure vessel body 1 with a cover 3 and a seal 2.

The inside temperature of the pressure vessel body was measured through a temperature measuring hole 4. A gold capsule, 33 mm–5 mm in diameter, was placed in the test tube. The starting material and solvent were poured into the test tube for hydrothermal synthesis. In this case, the pressure between the inside and the outside of the capsule was balanced by filling the inside of the pressure vessel with distilled water.

By using various solvents, the result of growing crystal for each solvent and the hydrothermal treatment conditions are shown in the following table I:

TABLE I

| solvent | Hydrothermal synthesis conditions | | Size* of crystal obtained |
|---|---|---|---|
| | temperature [°C] | pressure [kg/cm$^2$] | |
| 3 Mol NaNO$_3$ | 300 | 750 | 0.2–0.3 mm |
| 3 Mol NaNO$_3$ | 300 | 750 | 0.2–0.3 mm |
| 3 Mol NaNO$_3$ | 370 | 750 | 0.3–0.5 mm |
| 3 Mol NaNO$_3$ | 420 | 500 | 0.1–0.2 mm |
| 3 Mol NaNO$_3$ | 450 | 750 | 0.8–1.0 mm |
| 3 Mol NaNO$_3$ | 500 | 750 | 1.0–1.2 mm |
| 3 Mol KNO$_3$ | 400 | 750 | 0.5–0.6 mm |
| 3 Mol KNO$_3$ | 400 | 1000 | 0.6–0.8 mm |
| 3 Mol LiNO$_3$ | 380 | 750 | 0.3–0.5 mm |
| 3 Mol LiNO$_3$ | 420 | 750 | 0.6–1.0 mm |
| 3.5 Mol Ca(NO$_3$)$_2$ | 180 | 1000 | not grown |
| 3.5 Mol Ca(NO$_3$)$_2$ | 200 | 750 | 0.1–0.2 mm |
| 4.0 Mol Ca(NO$_3$)$_2$ | 240 | 750 | 0.3–0.4 mm |
| 3.5 Mol Ca(NO$_3$)$_2$ | 280 | 1000 | 0.3–0.5 mm |
| 3.0 Mol Ca(NO$_3$)$_2$ | 320 | 800 | 0.4–0.5 mm |
| 3.5 Mol Ca(NO$_3$)$_2$ | 360 | 750 | 0.6–0.7 mm |
| 3.5 Mol Ca(NO$_3$)$_2$ | 400 | 1000 | 0.8–1.0 mm |
| 3.0 Mol Ca(NO$_3$)$_2$ | 440 | 750 | 0.8–1.2 mm |
| 1.0 Mol NH$_4$NO$_3$ | 100 | 1000 | not grown |
| 1.0 Mol NH$_4$NO$_3$ | 120 | 1000 | 0.2 mm |
| 1.0 Mol NH$_4$NO$_3$ | 140 | 1000 | 0.4–0.6 mm |
| 0.8 Mol NH$_4$NO$_3$ | 170 | 1000 | 0.6–1.0 mm |
| 0.8 Mol NH$_4$NO$_3$ | 200 | 1000 | 0.8–1.2 mm |
| 0.5 Mol NH$_4$NO$_3$ | 240 | 750 | 0.8–1.1 mm |
| 0.5 Mol NH$_4$NO$_3$ | 280 | 750 | 0.9–1.2 mm |
| 0.5 Mol NH$_4$NO$_3$ | 320 | 1000 | 1.0–1.4 mm |
| 0.5 Mol NH$_4$NO$_3$ | 360 | 750 | 1.2–1.5 mm |
| 0.5 Mol NH$_4$NO$_3$ | 100 | 1000 | 0.2 mm |
| 0.5 Mol NH$_4$NO$_3$ | 120 | 1000 | 0.3 mm |
| 0.1 Mol NH$_4$NO$_3$ | 150 | 1000 | 0.3 mm |
| 0.02 Mol NH$_4$NO$_3$ | 170 | 1000 | 0.2 mm |
| 0.01 Mol NH$_4$NO$_3$ | 200 | 1000 | 0.2 mm |
| 0.01 Mol NH$_4$NO$_3$ | 240 | 800 | 0.3 mm |
| 0.01 Mol NH$_4$NO$_3$ | 280 | 500 | 0.4 mm |
| 0.01 Mol NH$_4$NO$_3$ | 360 | 500 | 0.4–0.6 mm |
| 0.02 Mol NH$_4$NO$_3$ | 320 | 500 | 0.4–0.7 mm |
| 3.0 Mol NH$_4$NO$_3$ | 100 | 300 | 0.2 mm |
| 3.0 Mol NH$_4$NO$_3$ | 120 | 300 | 0.4 mm |
| 3.0 Mol NH$_4$NO$_3$ | 140 | 200 | 0.3–0.5 mm |
| 3.0 Mol NH$_4$NO$_3$ | 170 | 100 | 0.3–0.6 mm |
| 3.0 Mol NH$_4$NO$_3$ | 200 | 100 | 0.3–0.6 mm |
| 3.0 Mol NH$_4$NO$_3$ | 240 | 50 | 0.4–0.6 mm |
| 3.0 Mol NH$_4$NO$_3$ | 280 | 50 | 0.5–0.7 mm |
| 3.0 Mol NH$_4$NO$_3$ | 320 | 20 | 0.5–0.7 mm |
| 3.0 Mol NH$_4$NO$_3$ | 360 | 20 | 0.7–0.9 mm |

*All growth periods were 7 days.

As shown in the above table I, it was found that crystals were grown by using any one of NaNO$_3$, KNO$_3$, LiNO$_3$, Ca(NO$_3$)$_2$ and NH$_4$NO$_3$ as the solvent. In the case of using the alkali nitrate aqueous solutions, namely NaNO$_3$, KNO$_3$ and LiNO$_3$, it is possible to grow crystal in the range of 300° to 500° C., and the preferable temperature range of the hydrothermal synthesis is in the range of 370° to 420° C. As for pressure, unlike the case of using an alkali carbonate aqueous solution, it is possible to grow crystals at a pressure lower than 1000 kg/cm$^2$, and a very good crystal growth at pressures of around 750 kg/cm$^2$ is achieved. By making the concentration of each alkali nitrate aqueous solution large, good crystal can be grown, however it is preferable to arrange the molar concentration to about 3 Mol in view of the relation with pressure because it is easier in handling. In the case of using Ca(NO$_3$)$_2$ aqueous solution, the preferable temperature range of the hydrothermal synthesis is in the range of 200° C. to 400° C. If the temperature is over 400° C., it is still possible to grow crystals, however, there is the possibility of reduced quality. In the case of NH$_4$NO$_3$ aqueous solution, the preferable temperature range of the hydrothermal synthesis is in the range of 100° to 360° C. If the temperature is over 360° C., it is possible to grow crystals, however, there is the possibility of reduced quality and corrosion of the pressure vessel. As for pressure, it is possible to grow crystals at pressure lower than 300 kg/cm$^2$ by selecting other hydrothermal synthesis conditions, e.g., the concentrations of the solvent or growth temperature. The $NH_4NO_3$ aqueous solution comprises preferably 0.01 to 3 Mol aqueous solution of $NH_4NO_3$. It was identified by X-ray diffraction that in each case, the crystals grown were calcium carbonate single crystal.

EXAMPLE 2

FIG. 2 is a sectional view illustrating a typical test tube used in this Example. The test tube was made of stellite 25 as in Example 1, however the inside was lined with platinum in order to avoid contamination by pollutants. A pressure vessel body 5 was sealed with a cover 7 through a sealing ring 6. At the bottom of the pressure vessel body 5, starting material 8 for the crystals to be grown was placed. The starting material was refined and recrystallized in nitrate solvent according to the method of Example 1 and was powdered. A crystal support frame 9 carried thereon a species or seed crystal 10 over the starting material 8 at an upper portion of the pressure vessel. The seed crystal 10 was a calcite with (0001) faces of natural optical grade. As the seed crystal, calcite with (1011) faces of natural optical grade may be used. It was necessary to choose a seed crystal with few internal inclusions, and little lattice displacement, etc. so that defects in the single crystal to be grown thereon may be avoided. A baffle 11 was provided between the starting material 8 and the seed crystal 10 to produce a temperature difference therebetween and was supported on the frame 9. The inside of the pressure vessel body 5 was filled up with nitrite aqueous solution, e.g., $NaNO_3$, $KNO_3$, $LiNO_3$, $Ca(NO_3)_2$ and $NH_4NO_3$, as a solvent at such a filling-up rate as to establish a predetermined temperature and pressure.

By using various solvents, the result of growing crystal for each solvent and the hydrothermal treatment are shown in the following table II:

The characteristics of the grown layer or film in each case were those of calcium carbonate single crystal and were identified by X-ray diffraction. Its optical characteristics were the same as those of natural calcite (with respect to permeability rate, compound refractive index, etc.).

Having described a specific embodiment of our invention, it is believed obvious that modification and variation of our invention is possible in light of the above teachings.

From the above discussion, it will be appreciated that it is easier for growth of calcium carbonate single crystals to be industrialized by hydrothermal synthesis because a pressure less than 1000 kg/cm$^2$ is used and, at the same time, defects inside the grown crystals are reduced as, compared with the prior art growth methods of calcium carbonate single crystal using alkali carbonate aqueous solutions.

The growth rate of the crystals is over twice that achieved by the prior art method and this is a very favorable feature in view of industrialization. In the case of using $NH_4NO_3$ aqueous solution, $CaCO_3$ single crystal is easily industrialized because of growth by lower pressure and lower temperature, e.g., lower than 300 kg/cm$^2$ pressure and temperature in the range of 100° to 360° C. It is thus possible for calcium carbonate single crystals of optical grade quality equal to that of natural calcite to be made industrially by the same technology as that for the current artificial crystals. To be industrially able to produce such crystals equal in quality to natural optical grade calcite will mean that it will be possible always to provide a market with such crystals with the same quality. Because of the dependence upon natural calcite, there has been no guarantee of either a regular supply or consistent quality. Industrialization of calcium carbonate single crystal will achieve such consistency and enhance their use in optical elements and parts, etc. used in a whole range of apparatus and will enable their characteristics to be improved.

What is claimed is:

TABLE II

| Solvent | Temperature of seed crystal | Temperature of starting material | Pressure | Growth period | Thickness of grown layer or film | Growth rate |
| --- | --- | --- | --- | --- | --- | --- |
| 3 Mol $NaNO_3$ | 370°C. | 420°C. | 750 kg/cm$^2$ | 50 day | 6.6 mm | 132 μm/day |
| 3.5 Mol $Ca(NO_3)_2$ | 360 | 400 | 750 | 50 | 7.0 | 140 |
| 3.5 Mol $Ca(NO_3)_2$ | 280 | 320 | 750 | 50 | 3.8 | 76 |
| 3.5 Mol $Ca(NO_3)_2$ | 200 | 260 | 750 | 50 | 2.2 | 44 |
| 0.5 Mol $NH_4NO_3$ | 280 | 320 | 750 | 50 | 10 | 200 |
| 0.5 Mol $NH_4NO_3$ | 220 | 260 | 750 | 50 | 8.9 | 178 |
| 0.8 Mol $NH_4NO_3$ | 160 | 200 | 1000 | 50 | 8.6 | 172 |
| 3 Mol $NH_4NO_3$ | 280 | 320 | 20 | 50 | 7.3 | 146 |
| 3 Mol $NH_4NO_3$ | 220 | 260 | 50 | 50 | 7.6 | 152 |
| 3 Mol $NH_4NO_3$ | 160 | 200 | 100 | 50 | 7.0 | 140 |
| 0.01 Mol $NH_4NO_3$ | 280 | 320 | 500 | 50 | 6.5 | 130 |
| 0.01 Mol $NH_4NO_3$ | 220 | 260 | 800 | 50 | 5.5 | 110 |
| 0.02 Mol $NH_4NO_3$ | 160 | 200 | 1000 | 50 | 4.0 | 80 |

1. A method of manufacturing calcium carbonate single crystal wherein the calcium carbonate single crystal is grown by hydrothermal synthesis which applies heat and pressure to a starting material composed of calcium carbonate crystal within a nitrate aqueous solution at a temperature and pressure effective to grow the calcium carbonate single crystal, said nitrate being either $Ca(NO_3)_2$ or $NH_4NO_3$.

2. The method according to claim 1; wherein the hydrothermal synthesis is carried out within $Ca(NO_3)_2$ aqueous solution at a temperature above 200° C.

3. The method according to claim 2; wherein the hydrothermal synthesis is carried out within $Ca(NO_3)_2$ aqueous solution at a temperature in the range of 200° to 400° C.

4. The method according to claim 2; wherein the $Ca(NO_3)_2$ aqueous solution has a molality of from 3 to 4.

5. The method according to claim 1; wherein the hydrothermal synthesis is carried out within $Ca(NO_3)_2$ aqueous solution and under a pressure less than 1000 kg/cm$^2$.

6. The method according to claim 1; wherein the hydrothermal synthesis is carried out within $NH_4NO_3$ aqueous solution and at a temperature above 100° C.

7. The method according to claim 6; wherein the hydrothermal synthesis is carried out within $NH_4NO_3$ aqueous solution and at a temperature in the range of 100° to 360° C.

8. The method according to claim 6; wherein the $NH_4NO_3$ aqueous solution has a molality of from 0.01 to 3.

9. The method according to claim 1; wherein the hydrothermal synthesis is carried out within $NH_4NO_3$ aqueous solution under a pressure less than 1000 kg/cm$^2$.

10. The method according to claim 9; wherein the hydrothermal synthesis is carried out under a pressure in the range of 20 to 300 kg/cm$^2$.

11. The method according to claim 1; wherein the hydrothermal synthesis is carried out in a pressure vessel and the calcium carbonate single crystal is deposited on the inside surface of the pressure vessel.

12. The method according to claim 1; wherein the hydrothermal synthesis is carried out in a pressure vessel, the starting material being placed at the bottom of the pressure vessel and a seed crystal being placed at the upper part of the pressure vessel.

13. The method according to claim 12; wherein the calcium carbonate single crystal is grown on the seed crystal.

14. A method of manufacturing calcium carbonate single crystal comprising the steps of: providing a starting material composed of calcium carbonate; dissolving the starting material in a nitrate aqueous solution which comprises either $Ca(NO_3)_2$ or $NH_4NO_3$, under application of heat and pressure; and hydrothermally synthesizing the starting material within the nitrate aqueous solution at a temperature and pressure effective to effect the growth of calcium carbonate single crystal.

15. The method according to claim 14; wherein the starting material is hydrothermally synthesized within $Ca(NO_3)_2$ aqueous solution at a temperature in the range of 200° to 400° C.

16. The method according to claim 14; wherein the starting material is hydrothermally synthesized within $NH_4NO_3$ aqueous solution at a temperature in the range of 100° to 360° C.

17. The method according to claim 14; wherein the starting material is hydrothermally synthesized within the nitrate aqueous solution within a pressure vessel so that the calcium carbonate single crystal is deposited on the inside surface of the pressure vessel.

18. The method according to claim 14; wherein the starting material is hydrothermally synthesized within the nitrate aqueous solution within a pressure vessel, the starting material being placed at the bottom of the pressure vessel and a seed crystal being placed at an upper portion of the pressure vessel so that the calcium carbonate single crystal is grown as a film on the seed crystal.

* * * * *